United States Patent [19]

Reymersdal et al.

[11] 4,327,423
[45] Apr. 27, 1982

[54] MAGNETIC BUBBLE TRANSDUCER

[75] Inventors: Joseph V. Reymersdal, Fairless Hills, Pa.; John H. Cooper, San Jose, Calif.

[73] Assignee: Sperry Corporation, New York, N.Y.

[21] Appl. No.: 170,344

[22] Filed: Jul. 21, 1980

[51] Int. Cl.³ .............................................. G11C 19/08
[52] U.S. Cl. ........................................ 365/8; 365/209
[58] Field of Search ............. 365/8, 158, 223, 207–210

[56] References Cited

U.S. PATENT DOCUMENTS 4,151,601 4/1979 Verhulst ................................. 365/8

OTHER PUBLICATIONS

IBM Technical Disclosure Bulletin—vol. 5; No. 3, Aug. 1962, pp. 26–27.

*Primary Examiner*—James W. Moffitt
*Attorney, Agent, or Firm*—Robert E. Lee, Jr.; John B. Sowell; Benjamin F. Griffin, Jr.

[57] ABSTRACT

A circuit arrangement is disclosed for sensing a presence or absence of a low-level output signal which may be used for detecting a change of resistance in a magnetic bubble detector. The circuit operates in a D.C. coupling mode whereby the low-level signals are directly coupled into a sense amplifier, which is preceded by the circuit above-mentioned. The circuit, which comprises a modified current mirror, is used as a resistance transducer which converts a change of resistance (ΔR) into a direct change of voltage (ΔE). The change of voltage provides an indication of the presence of, for example, a magnetic bubble.

5 Claims, 4 Drawing Figures

MAGNETIC BUBBLE TRANSDUCER

BACKGROUND OF THE INVENTION

1. Field of the Invention

The present invention relates to the field of electrical signal detection of a low-level magnitude and, particularly, those low-level electrical signals that emanate from a bubble memory device.

2. Description of the Prior Art

The known prior art for detecting electrical low-level bubble signals is a complicated one and is not suitable for forming into an integrated circuit (IC) chip. As is well known, forming an electrical circuit which is composed of discrete circuit elements comprising resistors, inductors and capacitors, into an IC chip enables a design to become more economical, reliable, and results in a reduction of size. The known prior art detection circuitry, which will be discussed in greater detail hereinafter, utilizes AC coupling in combination with a complicated bridge circuit. In addition, this prior art scheme requires two DC sources of power. As is well understood by those skilled in the art, AC coupling requires more components such as high-valued capacitors in order to allow passage of a low-frequency component of non-repetitive digital information. Furthermore, in the prior art bridge circuitry, the losses of voltage signal value is considerable.

In the present invention, DC coupling provides simplicity of operation and requires only one power source. Furthermore, the circuitry of this invention does not sustain the power losses mentioned above in the prior art bridge circuitry.

SUMMARY OF THE INVENTION

The instant invention is directed to a circuit arrangement for detecting a change of resistance which, in turn, will provide a corresponding voltage change. The voltage change may be used as an indication that a magnetic bubble has been detected in the circuit. The circuit arrangement comprises two transistors, which are connected to one another to carry two main currents which tend to mirror one another so that the voltage change becomes a function of a change of resistance only. In other words, since the circuit arrangement utilized in this invention maintains the two main currents (i.e., collector currents) which are relatively equal to one another, the change in voltage which is an indication of a bubble's presence in a memory is directly related to a resistance change only. The main collector currents through the two transistors are maintained at an equal value by fabricating them so that they have equal betas (current gain of a transistor) and equal respective Vbe (voltage across a base and emitter junction of a transistor).

DETAILED DESCRIPTION OF THE INVENTION

Figure 1:
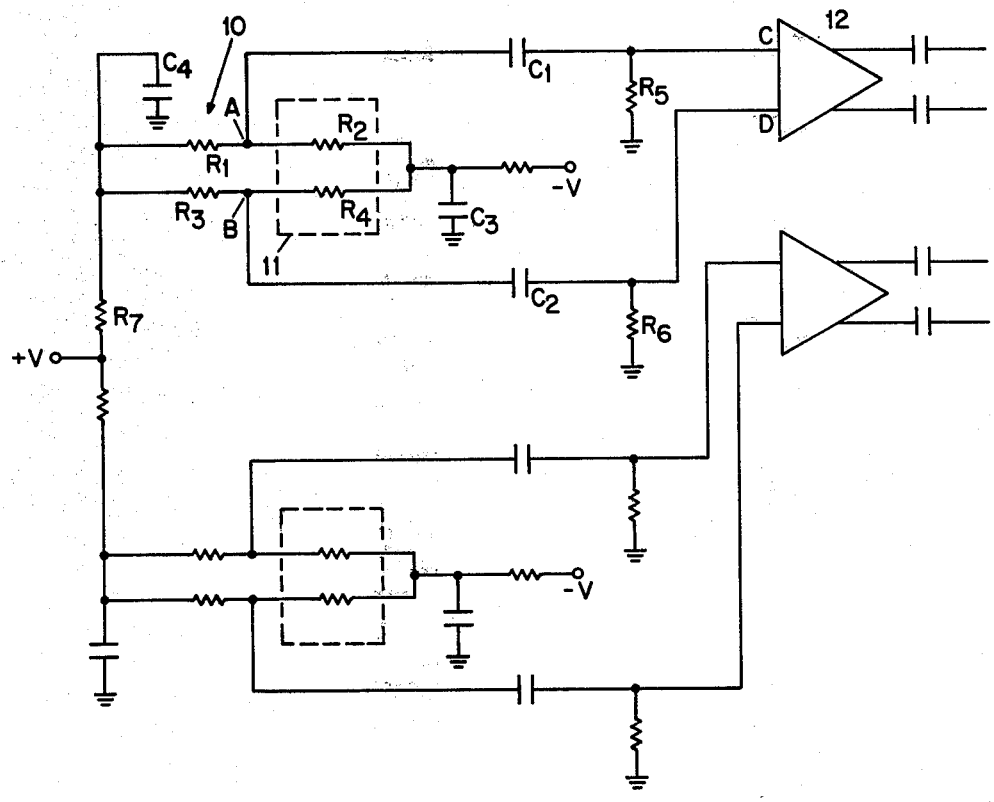
FIG. 1 depicts a known prior art arrangement for detecting a presence or absence of a magnetic bubble using AC coupling.

Referring now to FIG. 1, which represents a known prior art technique for sensing the presence or absence of a magnetic bubble, a bridge circuit 10 comprising resistors R1, R2, R3 and R4 are utilized. A bubble chip 11, which is surrounded by a dotted line, includes resistor sensors R2, R4. Resistors R2, R4 comprise magnetoresistive Permalloy sensor strips which are positioned over a well-known chevron-shaped stretcher (not shown) of a bubble propagation loop. It should be understood by those skilled in the art that bubble chip 11 includes major and minor bubble loops as well as other elements required for operation of a bubble memory, but which are not shown for purposes of simplicity. Chevron stretchers are used with a resistance sensor to stretch a bubble's dimensions in order to obtain a greater output signal therefrom. The output signal of a bubble element is on an order of 5 millivolts. Resistance sensors R2, R4 are elements whose resistance changes in a presence of a magnetic field such as a field emanating from a magnetic bubble when passing in its immediate vicinity or a proximately-positioned rotating magnetic field. A signal emanating from the bridge circuit 10 which indicates presence of a bubble is coupled via capacitors C1, C2 into input terminals C, D of an amplifier 12. Amplifier 12 is a differential sense amplifier which converts analog input signals into a digital output. Details of this circuit may be found in "Linear Integrated Circuits Data Book," Third Edition, by Motorola Semiconductor Products, Inc., under type MC1544.

Additional electrical components to those abovementioned, namely, C1, C2, R1 and R3, are required for operation of the prior art circuitry described in FIG. 1 such as, for example, resistors R5, R6 and R7. Resistors R5 and R7 are necessary in order to reference the bridge output signals emanating from output terminals A and B to ground after passing through coupling capacitors C1, C2. In other words, if these signals were not referenced to ground by means of resistors R5, R7, the signals would tend to float after passing through capacitors C1, C2. In addition to the above-mentioned circuit components, elements R6 and C3 are required because the prior art circuitry requires an additional power supply, −V. Capacitor C3 is of relatively large value so as to provide a low impedance so that noise may be shorted to ground.

In summary, therefore, it will be shown that prior art circuit arrangement of FIG. 1 for detecting bubble memories requires five resistors (R1, R3, R5, R6, R7) and three capacitors (C1, C2, C3) which are not required in the circuitry provided by this invention. This aspect will become apparent as the instant invention is described below.

Figure 2:
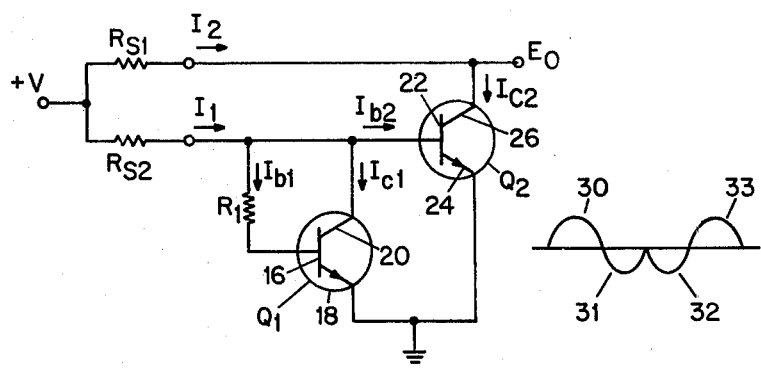
FIG. 2 depicts a circuit arrangement utilized in the present invention.

Referring now to FIG. 2, there is depicted a preferred circuit arrangement which is utilized in the instant invention. The shown circuit is referred to as a current mirror which consists essentially of two NPN transistors, Q1, Q2, connected in a front-to-back configuration such that their respective collector currents travel over two separate lines. It will be shown below that the magnitude of the two collector currents remain substantially equal, either quiescently or when in a dynamic or active state.

The two transistors, Q1, Q2 of the circuit arrangement of FIG. 2 are designed with matched high betas ($\beta$), which may be defined as the current gain of a transistor, or a ratio of a small change in base current to a resulting larger change in collector current, collector voltage being constant. The betas of Q1, Q2 may be on an order of 200–300. Quiescently, the circuit operates in the following manner.

In the quiescent operation, the base-emitter junctions 16, 18 and 22, 24 of transistors Q1, Q2 are forward-biased since respective emitters 18, 24 are at ground potential, whereas base junctions 16, 22 are connected to $+V$ through resistor Rs2. The forward biasing of the base-emitter junctions of transistors Q1, Q2 causes currents Ib1 and Ib2 to flow therethrough to ground. The forward biasing of the base-emitter junctions of transistors Q1, Q2 causes collector currents Ic1 and Ic2 to flow through the collector-emitter junctions 26, 24 and 20, 18 to ground. Therefore, the output voltage Eo is approximately at ground potential. It should be noted that collector currents Ic1 and Ic2 originate from main currents I1, I2 that emanate from $+V$ and thence through sensor resistances Rs1, Rs2, and sensor resistances Rs1 and Rs2 are equivalent to R2 and R4, respectively (FIG. 1). It should be further noted in FIG. 2 that main current I2 is equal to Ic2, whereas main current I1 is equal to Ib1+Ic1+Ib2.

As previously mentioned, the betas ($\beta 1$, $\beta 2$) of transistors Q1, Q2 are matched to one another. Furthermore, the voltage (Vbe) across the respective base-emitter junctions 16, 18 and 22, 24 are equal. The voltages Vbe1 and Vbe2 of transistors Q1, Q2, respectively, are equal because they are connected across the same two nodes and, moreover, because the base-emitter junctions 16, 18 and 22, 24 are matched. If Vbe across both base-emitter junctions 16, 18 and 22, 24 of transistors Q1, Q2 are equal, then base currents Ib1 and Ib2 are equal. Accordingly, the collector currents Ic1 and Ic2 are equal, since:

Ic1=$\beta$Ib1 and
Ic2=$\beta$Ib2
where $\beta = \beta 1 = \beta 2$

Main currents I1, I2 are nearly equal to each other as can be demonstrated below. Since transistors Q1 and Q2 are matched, it is understood that their respective Betas are equal, that is, $\beta 1 = \beta 2$, their base-emitter voltages Vbe are equal (i.e., a voltage across the base-emitter junction 16, 18 and 22, 24), and respective intrinsic base resistances rb of each transistor Q1, Q2 are equal.

For I1 to equal I2 the following relationship must exist:

$$Ib1+Ib2+\beta Ib1=\beta Ib2 \qquad (1)$$

where $\beta$Ib1=Ic1 and $\beta$Ib2=Ic2

The following equation results from the fact that respective voltages are taken across a same node (i.e., across terminal of e1 and ground):

$$Ib1(Rs+rb)=Ib2(rb) \qquad (2)$$

wherein rb is a basic intrinsic resistance of transistors Q1, Q2 and Rs is an external resistor in circuit of transistor Q1.

Solving for Ib1 in equation (2) and substituting therefore in equation (1), the following is established;

$$Rs=(2rb)/(\beta-1) \qquad (3)$$

The relationship for resistor Rs expressed in equation (3) assures that main current I1 will equal current I2 for all practical purposes. It should be noted however that if $\beta >> rb$, Rs can be ignored in the above equation since rb is small (i.e., less than 10 ohms whereas $\beta$ has a value magnitude which is 100 or greater).

Let us turn now to an operation of the circuit of FIG. 2 when it is in an active state. The active state results when one of the two sensor resistors Rs1, Rs2 changes its value. The reason for this change of value will be discussed in a later paragraph. In any event, let us assume that resistor Rs1 decreases in value. A voltage drop across this resistor, therefore, will decrease and a voltage output at terminal Eo will increase as depicted by signal 30. It should be appreciated that the voltage $+V$ exists across resistor sensor Rs1 and across transistor Q2. It should be noted hereat that the current I2 (substantially equal to I1) remains the same during this resistor change, because its value is determined by voltages $+V$, Vbe and sensor resistor Rs2 by reason of $$I1=(+V-Vbe2)/(Rs2)$$

as long as $Rs2 \geq Rs1$. In other words, I2 mirrors the current I1. Since the current I2 remains unchanged even though resistor Rs1 is reduced in value, the only parameter that may reflect this resistance change is the voltage output Eo. Accordingly, it will be recognized that the voltage output Eo directly reflects a change of resistance in resistor Rs1. When resistor Rs1 returns to its normal state by increasing its value, the signal 31 is generated, as explained hereinafter. Thus, when resistor Rs1 increases in value, the voltage drop across resistor Rs1 increases. Therefore, the output Eo decreases in view of the fact the voltage drop across the collector-emitter junction of transistor Q2 decreases. In other words, the output voltage Eo again directly changes as there is a change in resistor Rs1 since current I2 does not change.

Let us now assume that the sensor resistive element Rs2 decreases in value immediately after resistor Rs1 returns to its normal state. When sensor Rs2 decreases in value, the main current I1, which flows from $+V$ to ground, increases in magnitude. If I1 increases in magnitude, the base currents Ib1, Ib2 must also increase as must the collector currents Ic1, Ic2. This results from the previously-discussed formula wherein Ic=$\beta$Ib and $\beta$ is constant. It can, therefore, be appreciated that an increase of the main current I1 will cause an equal increase of current of Ic2, which is equal to I2. As a result of I2 gaining in magnitude, the voltage drop across sensor Rs1 will increase and the corresponding output Eo will decrease as shown by signal 32. In other words, the total voltage drops across resistor Rs1 and transistor Q2 must be $+V$. As soon as resistor sensor Rs2 returns to its normal state, by an increase in its resistance value, the current I1 will decrease which causes a corresponding decrease in circuit I2. Therefore, the voltage drop across Rs1 will decrease and the voltage drop across the collector-emitter junctions 26, 24 of transistor Q2 will increase as depicted by signal 33. On the other hand, when both resistors Rs1, Rs2 change simultaneously, there will be no change of the output voltage Eo as will be discussed below.

Figure 3:
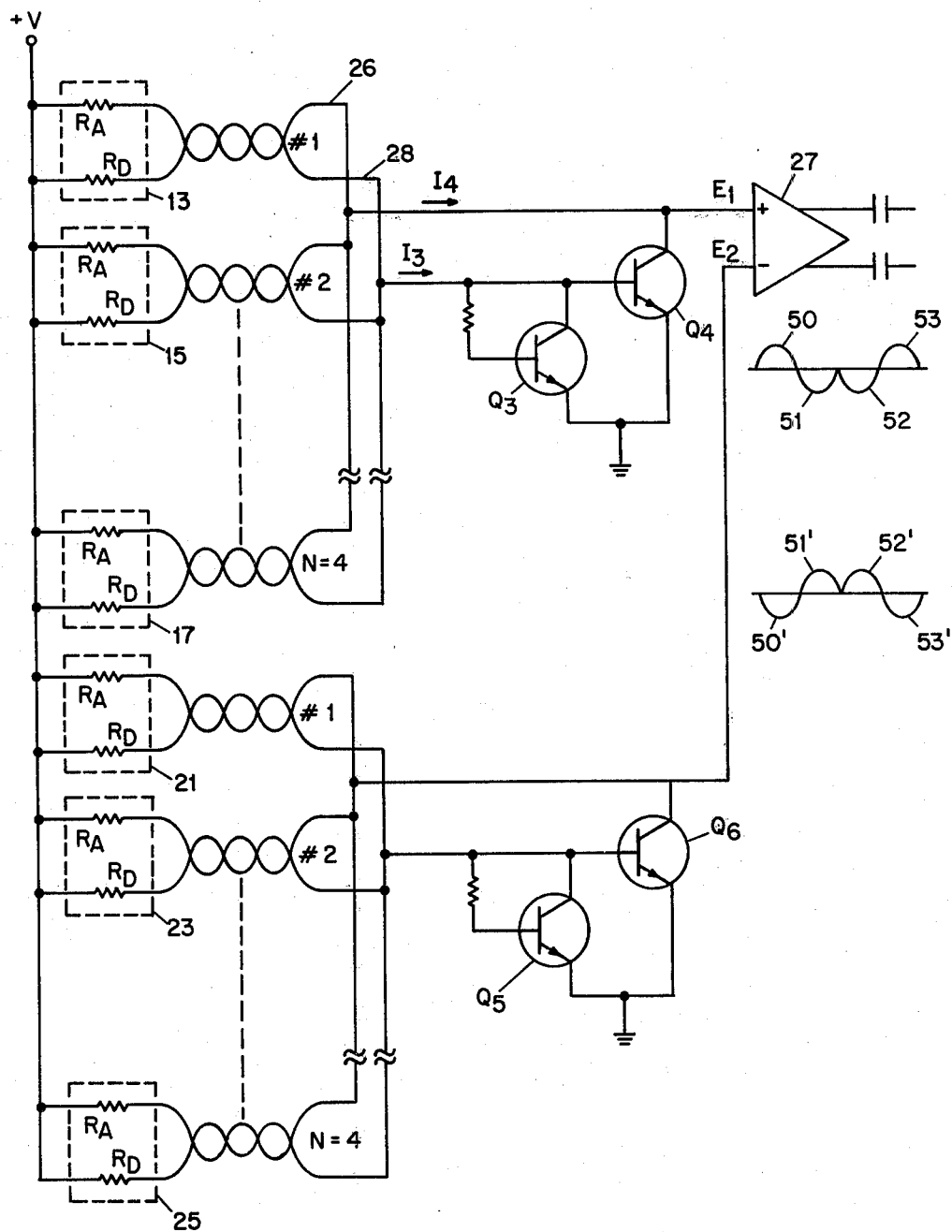
FIG. 3 illustrates the circuit arrangement of FIG. 2 which is utilized in a DC coupling mode with a plurality of bubble chips in a system.

Reference is now made to FIG. 3, wherein the circuit arrangement of FIG. 2 is utilized for sensing a presence or absence of a magnetic bubble in a bubble memory system. A plurality of bubble chips 13, 15, 17, 21, 23, 25, are arranged such that eight different bubble circuits are symmetrically connected to a plus (+) as well as to a negative (−) terminal of sense amplifier 27 (i.e., N=4 and four chips are connected to the +, and four chips are connected to the − terminal of sense amplifier 27). The bubble chip was previously described with respect to FIG. 1. It will be recalled that each bubble chip or circuit utilizes two sensor resistor strips, $R_A$ (active resistor), $R_D$ (dummy resistor). Resistors $R_A$, $R_D$ correspond to sensor resistor strips R2, R4 (FIG. 1) as previously described, and Rs1, Rs2 (FIG. 2). Sensor resistor $R_D$ is required to provide a common-mode rejection scheme of noise induced into sensor resistor $R_A$. Noise is induced into the resistor sensors $R_A$ and $R_D$ because each bubble chip is associated with a rotating magnetic field (not shown) which is generated in the plane of these resistors. As is understood in the art, an associated rotating field is switched into an active state one bubble chip at a time with respect to any one of the eight bubble circuits when a read/write cycle is to be performed. The rotating magnetic field which is generated is sinusoidal in nature, and causes the values of resistors $R_A$, $R_D$ to rise and fall in unison since it will be recalled that the value of each resistor changes in the presence of a magnetic field. This corresponding change of value in resistors $R_A$, $R_D$ is considered a noise signal because it is deleterious to circuit performance, and is eliminated by the common-mode rejection scheme in the system shown in FIG. 3, as will be discussed in detail below. Transistors Q3, Q4 and Q5, Q6 are matched pairs so as to produce identical outputs.

Let us assume that values of sensor resistors $R_A$, $R_D$ increase in unison in view of the presence of the magnetic rotating field. For a moment, it will be considered that no bubble propagation occurs so that the effect of noise in the circuit can be considered. Therefore, a quiescent current I3 flowing in resistor $R_D$ from +V to ground through respective base-emitter junctions of transistors Q3, Q4 is changed by decreasing in value and a voltage drop across $R_D$ decreases so that output voltage E1 increases. In other words, the fixed voltage +V provides a voltage drop across resistor $R_D$ and transistor Q4 and if the voltage drop across resistor $R_D$ decreases, the voltage drop across the transistor Q4 (i.e., the collector-emitter junction) must increase.

When quiescent current I3 decreases through $R_D$, current I4 will decrease through sensor resistor $R_A$ for the reason previously discussed and a voltage drop across $R_A$ will increase and the output voltage E1 will decrease. The simultaneous increase and decrease of output voltage at output E1 will effectively cancel each other at the + input terminal. Accordingly, it is apparent that use of the active sensor resistor $R_A$ in combination with a dummy resistor $R_D$ in the circuit of this invention achieves noise cancellation at the + input terminal of sense amplifier 27. It should be understood that like cancellation will occur when the resistance values of resistors $R_A$, $R_D$ decrease in unison, due to the rotating magnetic field.

It should be noted that transistors Q5, Q6 are also in a conducting quiescently at this time, and are conducting through their respective base-emitter and collector-emitter junction from +V to ground. Therefore, the voltage output E2 of transistor Q6 which is directed to the − input of sense amplifier 27 is near ground potential. In this respect, the noise signal discussed above with respect to the + terminal of sense amplifier 27 will be superimposed upon the near ground signal at which the collector of transistor Q4 sits. Accordingly, the output signal E1 which is a noise signal will be self cancelling because of the circuit comprising transistors Q3, Q4, whereas the near ground signals E1, E2 resulting from the conduction of transistors Q3, Q4, Q5, Q6, will be cancelled by differential sense amplifier 27.

Let us now turn to an operation of the system of FIG. 3 wherein the rotation of magnetic field with respect to bubble chip 13 will cause a bubble to be detected. As understood from the above discussion, the induced noise from the rotating field will be eliminated. As soon as a bubble is propagated under the Permalloy sensor strip or resistor $R_A$, its resistance (in the manner of Rs1 in FIG. 2) will decrease. As also previously described with respect to FIG. 2, the output voltage E1 will increase to directly reflect the change in resistance of sensor $R_A$. At this time, the output voltage E2 remains near ground. The positive output 50 is shown as produced by the sense amplifier 27. When the resistor strip returns to its normal state, a negative signal 51 is generated. The reason for this negative signal is that when the resistor strip $R_A$ increases in returning to its normal state, the current I4 decreases so that the voltage drop across $R_A$ increases and, therefore, the voltage drop across the collector-emitter junction of transistor Q4 must decrease. It will be recalled that +V is the voltage drop across these two elements.

Upon passing the resistor strip $R_A$, the bubble is next propagated past strip $R_D$, whereby the value of strip $R_D$ will decrease and the output voltage E1 will also decrease. Output voltage E1 decreases because when current I3 decreases, current I4 decreases, thereby causing a voltage across $R_A$ to increase and correspondingly, the voltage across transistor Q4 to decrease. This negative signal is shown as signal 52. The analysis for this mirror circuit behavior was described with respect to FIG. 2 and, in particular, when sensor resistor Rs2 decreased. A positive signal 53 is generated when sensor resistor strip $R_D$ returns to its normal value in a manner previously described with respect to the signal 33 of FIG. 2.

Referring now to the bubble chips 21, 23 and 25 in the lower half of the system, it is noted that the resistor strips $R_A$, $R_D$ are connected in a slightly different manner to transistors Q5, Q6 than the bubble chips 13, 15, and 17 are connected to transistors Q3, Q4 except that a collector electrode of transistor Q4 is directed to a positive input terminal of amplifier 27, whereas its negative terminal is connected to a collector electrode of transistor Q6. The operation will be precisely the same as above described with respect to bubble chips 13, 15 and 17, except that the output signals 50′, 51′, 52′ and 53′ directed into input terminal E2 are opposite in polarity from signals 50, 51, 52 and 53. The reason for this is that the resistors $R_A$, $R_D$ connected to chips 21, 23 and 25 are interchanged from a connection of resistors $R_A$, $R_D$ connected to chips 13, 15, 17, because operation of sense amplifier 27 requires that the output E1 must go positive with respect to E2, or E2 must go negative with respect to E1. Therefore, output signal 50, 50′, 53, 53′, can be detected by sense amplifier 27.

Figure 4:
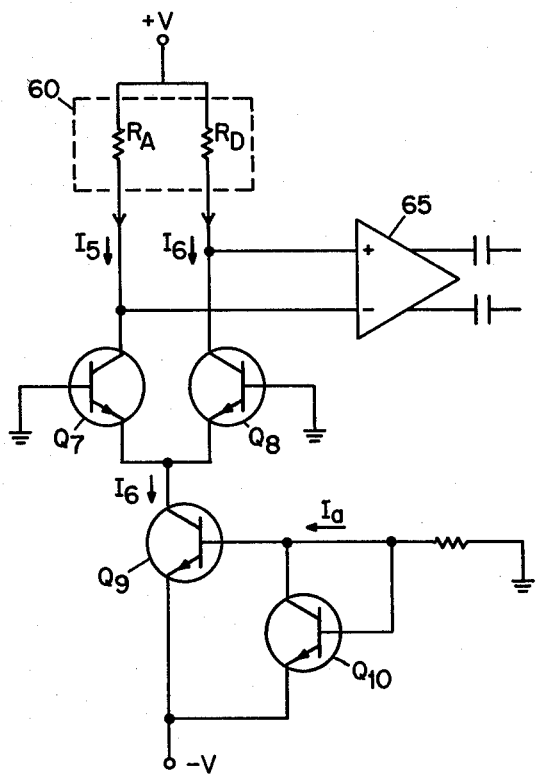
FIG. 4 shows another circuit utilized in a DC coupling mode for detecting a low-level signal in order to sense the presence or absence of a magnetic bubble.

Referring now to FIG. 4, there is depicted another circuit which may be substituted in the system described above in FIG. 3. The lower half of the circuit, comprising transistors Q9, Q10 is similar to the circuit described in FIG. 2, but used in a current source configuration. FIG. 2 of this invention does not use the circuit as a current source. In the circuit comprising transistors Q7, Q8, the currents I5, I6, are equal when these transistors are matched. A bubble chip 60 including resistor sensors $R_A$, $R_D$ are utilized in the manner previously described. Any change in value of resistors $R_A$, $R_D$ will result in a voltage change at the +, − input terminals of a differential amplifier 65. In this circuit, it is important that transistors Q7, Q8 stay out of saturation. The current source comprising transistors Q9, Q10 is used to supply currents I5, I6, in such a manner that the voltage drops across $R_A$, $R_D$ do not exceed the +V power supply voltage.

In summary, it can be readily appreciated that the present invention provides simplicity in organization over that shown in the prior art. In particular, DC instead of AC coupling, a single power supply, as well as providing a circuit which acts as a transducer to convert a change of resistance (R) into a change of voltage output (E) are deemed salient advantages which are not realized by the prior art.

What is claimed is:

1. A system for detecting a presence of a magnetic bubble comprising:
   (a) first and second groups of bubble detectors wherein each said group has an equal number of resistive detectors;
   (b) an amplifier means having first and second inputs wherein said amplifier operates in a differential mode;
   (c) first and second semiconductor means wherein the first semiconductor is coupled between said first group of bubble detectors and one said amplifier input, and said second semiconductor means is coupled between said second group of bubble detectors and the other said amplifier input,
   (d) said semiconductor means directly converting a resistance change within one said resistive detectors due to a presence of a magnetic bubble into a direct change of voltage.

2. The system for detecting a presence of a magnetic bubble in accordance with claim 1 wherein said first and second semiconductor means respectively comprises:
   (a) first and second NPN transistors, each having a respective base, emitter and collector electrode; and
   (b) first and second input lines;
   (c) wherein said respective emitters are connected to one another to a neutral or ground potential, and said base and collector electrodes of said first transistor and said base of said second transistor are connected to one another and to said second input line, whereas said collector of said first transistor is connected to said first input lines and
   (d) said input lines being coupled to said first or alternatively said second group of bubble detectors.

3. A circuit arrangement for detecting a presence of a magnetic bubble comprising:
   (a) first and second groups of bubble detectors wherein each said group has an equal number of resistive detectors and a corresponding number of dummy detectors such that one resistive detector is associated with a respective dummy detector;
   (b) an amplifier means having first and second inputs wherein said amplifier operates in a differential mode;
   (c) first and second semiconductor means wherein the first semiconductor means is coupled between said first group of bubble detectors and one said amplifier input, and said second semiconductor means is coupled between said second group of bubble detectors and the other said amplifier input,
   (d) said first and second semiconductor means being arranged to provide currents that mirror one another through associated resistive and dummy detectors,
   (e) whereby a resistance change in one said detector is translated into a voltage change which is sensed by said amplifier means.

4. A system for detecting a presence of a magnetic bubble comprising,
   (a) first and second groups of bubble detectors wherein each said group is populated with an equal number of resistive detectors, and each said detector is associated with a corresponding dummy detector;
   (b) means for connecting the respective resistive detectors of each separate group together as well as connecting the respective dummy detectors of each separate group together as well as connecting the respective dummy detectors of each separate group together;
   (c) an amplifier means having first and second inputs wherein said amplifier operates in a differential mode;
   (d) first and second semiconductor means wherein the first semiconductor means is coupled between the first input of said amplifier, and to both said means for connecting the respective resistive detectors of said first group together as well as to said means for connecting the respective dummy detectors together; and
   (e) wherein the second semiconductor means is coupled between the second input of said amplifier, and to both said means for connecting the respective resistive detectors of said second group together as well as to said means for connecting the respective dummy detectors together.

5. A circuit arrangement comprising:
   (a) first and second NPN transistors having respective emitter, base and collector electrodes wherein said respective emitter electrodes of said first and second transistors are connected to each other as well as to ground potential, and said base through a resistor and said collector electrodes of said first transistor and base electrode of said second transistor being connected to each other;
   (b) first and second sensor resistors wherein resistance values of said sensors are altered in the presence of a magnetic field;
   (c) a voltage source, said first resistor being connected intermediate said voltage source and the collector electrode of said second transistor, and said second resistor being connected intermediate said base electrode of said second transistor and said voltage source, whereby a change of value of said first or alternatively, said second resistor by a magnetic field causes a corresponding change in voltage output across the collector-emitter electrodes of said second transistor,
   (d) a sense amplifier means having first and second inputs wherein said amplifier operates in a differential mode, said voltage outputs across said collector-emitter electrodes being serially applied to one said input of said amplifier means;

(e) third and fourth NPN transistors having respective emitter, base and collector electrodes wherein said respective emitter electrodes of said third and fourth transistors are connected to each other as well as to ground potential and said base of said third transistor and base electrode of said fourth transistor being connected to each other;

(f) third and fourth sensor resistors wherein resistance values of said sensors are altered in the presence of a magnetic field, said third resistor being connected intermediate said voltage source and collector electrode of said fourth transistor and said fourth resistor being connected intermediate said base electrode of said fourth transistor and said voltage source, whereby a change of value of said third or alternately said fourth resistor by a magnetic field causes a corresponding change in voltage output across the collector-emitter electrodes of said fourth transistor, said voltage output being directed to the other said input of said amplifier means.

* * * * *